United States Patent
Sciutti et al.

(10) Patent No.: US 9,226,079 B2
(45) Date of Patent: Dec. 29, 2015

(54) MICROELECTROMECHANICAL SENSING STRUCTURE FOR A CAPACITIVE ACOUSTIC TRANSDUCER INCLUDING AN ELEMENT LIMITING THE OSCILLATIONS OF A MEMBRANE, AND MANUFACTURING METHOD THEREOF

(71) Applicant: STMicroelectronics S.r.l., Agrate Brianza (IT)

(72) Inventors: Alessandra Sciutti, Concorezzo (IT); Matteo Perletti, Vaprio d'Adda (IT); Sebastiano Conti, Mistretta (IT); Roberto Carminati, Piancogno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/220,985

(22) Filed: Mar. 20, 2014

(65) Prior Publication Data
US 2014/0286509 A1 Sep. 25, 2014

(30) Foreign Application Priority Data
Mar. 21, 2013 (IT) .............................. TO2013A0225

(51) Int. Cl.
*H04R 25/00* (2006.01)
*H04R 19/00* (2006.01)
*H04R 19/04* (2006.01)

(52) U.S. Cl.
CPC .............. *H04R 19/005* (2013.01); *H04R 19/04* (2013.01); *B81B 2201/0257* (2013.01)

(58) Field of Classification Search
CPC ...... H04R 11/04; H04R 19/005; H04R 19/04; B81B 2201/0257
See application file for complete search history.

(56) References Cited

U.S. PATENT DOCUMENTS

| 8,049,287 B2 | 11/2011 | Combi et al. |
| 8,089,828 B2 | 1/2012 | Fischer et al. |

(Continued)

FOREIGN PATENT DOCUMENTS

| DE | 10 2008 001 185 A1 | 10/2009 |
| EP | 1 577 656 A1 | 9/2005 |

(Continued)

OTHER PUBLICATIONS

Je et al., "The novel sensitivity improved surface micromachined MEMS microphone with the center-hole membrane," *Procedia Engineering*25:583-586, 2011.

*Primary Examiner* — Tuan D Nguyen
(74) *Attorney, Agent, or Firm* — Seed IP Law Group PLLC

(57) ABSTRACT

A microelectromechanical sensing structure for a capacitive acoustic transducer, including: a semiconductor substrate; a rigid electrode; and a membrane set between the substrate and the rigid electrode, the membrane having a first surface and a second surface, which are in fluid communication, respectively, with a first chamber and a second chamber, respectively, the first chamber being delimited at least in part by a first wall portion and a second wall portion formed at least in part by the substrate, the second chamber being delimited at least in part by the rigid electrode, the membrane being moreover designed to undergo deformation following upon incidence of pressure waves and facing the rigid electrode so as to form a sensing capacitor having a capacitance that varies as a function of the deformation of the membrane. The structure moreover includes a beam, which is connected to the first and second wall portions and is designed to limit the oscillations of the membrane.

21 Claims, 7 Drawing Sheets

(56) References Cited

U.S. PATENT DOCUMENTS

| | | |
|---|---|---|
| 2007/0286438 A1 | 12/2007 | Hirade et al. |
| 2009/0085191 A1 | 4/2009 | Najafi et al. |
| 2009/0260226 A1 | 10/2009 | Tinguely et al. |
| 2010/0002543 A1 | 1/2010 | Schlosser et al. |
| 2010/0038733 A1 | 2/2010 | Minervini |
| 2010/0061073 A1 | 3/2010 | Oldsen et al. |
| 2010/0135123 A1* | 6/2010 | Fischer et al. ............ 367/181 |
| 2010/0158279 A1 | 6/2010 | Conti et al. |
| 2010/0164025 A1 | 7/2010 | Yang |
| 2010/0251818 A1 | 10/2010 | Ge et al. |
| 2010/0284553 A1 | 11/2010 | Conti et al. |
| 2011/0123053 A1 | 5/2011 | Wang et al. |
| 2012/0082325 A1 | 4/2012 | Sakurauchi et al. |
| 2012/0139066 A1 | 6/2012 | Je et al. |
| 2013/0098155 A1 | 4/2013 | Ohta et al. |
| 2013/0283912 A1 | 10/2013 | Lin |
| 2014/0286509 A1 | 9/2014 | Sciutti et al. |
| 2014/0299948 A1 | 10/2014 | Wang et al. |

FOREIGN PATENT DOCUMENTS

| | | |
|---|---|---|
| EP | 2 214 421 A1 | 8/2010 |
| EP | 2 252 077 A1 | 11/2010 |
| WO | 2011/114398 A1 | 9/2011 |

* cited by examiner

MICROELECTROMECHANICAL SENSING STRUCTURE FOR A CAPACITIVE ACOUSTIC TRANSDUCER INCLUDING AN ELEMENT LIMITING THE OSCILLATIONS OF A MEMBRANE, AND MANUFACTURING METHOD THEREOF

BACKGROUND

1. Technical Field

The present disclosure relates to a microelectromechanical sensing structure of MEMS (microelectromechanical system) type for a capacitive acoustic transducer, in particular, for a microelectromechanical capacitive microphone, to which the ensuing treatment will make explicit reference, without this implying any loss of generality. The microelectromechanical sensing structure includes an element for limiting the oscillations of a membrane. Furthermore, the present disclosure relates to a method for manufacturing the microelectromechanical sensing structure.

2. Description of the Related Art

As is known, an acoustic transducer, for example a MEMS microphone of a capacitive type, generally comprises a microelectromechanical sensing structure designed to transduce acoustic waves, i.e., pressure waves, into an electrical quantity, in particular into an electrical quantity indicating a capacitive variation. In addition, the MEMS microphone comprises read electronics, which is designed to carry out appropriate operations of processing (for example, operations of amplification and filtering) of the electrical quantity, so as to supply an electrical output signal, typically formed by a voltage.

The microelectromechanical sensing structure usually comprises a mobile electrode, provided as diaphragm or membrane, which is arranged facing a fixed electrode so as to form, together with this fixed electrode, the plates of a sensing capacitor, which is of the variable-capacitance type. The mobile electrode is generally anchored, by means of a perimetral portion thereof, to a substrate, whereas a central portion thereof is free to bend following upon incidence of a pressure wave. The variation in capacitance of the sensing capacitor is caused by the deflection of the membrane that forms the mobile electrode, this membrane being precisely put in oscillation by the pressure wave.

By way of example, FIG. 1 shows a microelectromechanical sensing structure 1 of a capacitive microphone M, as described for example in the patent No. EP2252077, also published as U.S. Patent Publication No. 2010/284553, filed in the name of the present applicant.

The microelectromechanical sensing structure 1 comprises a membrane 2, which is mobile, is made of conductive material, and is arranged facing a rigid plate 3, generally known as "back plate," which is, as has been said, rigid, at least if compared with the membrane 2, which is, instead, flexible.

The rigid plate 3 is formed by a first plate layer 4a, made of conductive material and set facing the membrane 2, and by a second plate layer 4b, made of insulating material.

The first plate layer 4a forms, together with the membrane 2, a sensing capacitor.

The second plate layer 4b is arranged on the first plate layer 4a, except for portions in which it extends through the first plate layer 4a so as to form protuberances P of the rigid plate 3, which extend towards the underlying membrane 2 and have the function of preventing adhesion of the membrane 2 to the rigid plate 3, as well as that of limiting the oscillations of the membrane 2.

The microelectromechanical sensing structure 1 further comprises a substrate 5 made of semiconductor material and an insulation layer 9, which is made, for example, of silicon nitride (SiN) and is arranged on top of the substrate 5, with which it is in direct contact.

In detail, the membrane 2 may have a thickness comprised, for example, in the range 0.3-1.5 µm and may be made of polysilicon, while the first and second plate layers 4a, 4b may have thicknesses, respectively, comprised, for example, in the ranges 0.5-2 µm and 0.7-2 µm and may be made, respectively, of polysilicon and silicon nitride. For example, the first and second plate layers 4a, 4b may have thicknesses, respectively, of 0.9 µm and 1.2 µm.

In use, the membrane 2 undergoes deformation as a function of the incident pressure wave. Furthermore, the membrane 2 is suspended over the substrate 5 and the insulation layer 9 and gives out directly onto a first cavity 6a. The first cavity 6a is formed within the substrate 5, by etching a back surface $S_b$ of the substrate 5, which is opposite to a front surface $S_a$ of the same substrate 5, on which the insulation layer 9 rests; this front surface $S_a$ is arranged in the proximity of the membrane 2. Furthermore, the etching is of a through type, i.e., it is made in such a way that, at the end of the etching process, the first cavity 6a defines a through hole that extends between the front surface $S_a$ and the back surface $S_b$.

More in particular, the first cavity 6a is formed by a first portion 7a and a second portion 7b, which communicate with one another. Arranged between the first and second portions 7a, 7b of the first cavity 6a is a perforated diaphragm X, formed by top portions (not etched) of the substrate 5 overlaid by portions of the insulation layer 9 that overlie these top portions.

The perforated diaphragm X forms an opening TH, the longitudinal axis H of which is normal to the membrane 2 when the latter is in the resting condition. Furthermore, the opening TH sets the first and second portions 7a, 7b of the first cavity 6a in communication; consequently, the opening TH defines a sort of third portion of the first cavity 6a.

The opening TH has, in a direction perpendicular to the longitudinal axis H and parallel to the front surface $S_a$, a cross section that is entirely overlaid by the membrane 2, which moreover extends laterally up to overlying at least part of the perforated diaphragm X. In other words, the membrane 2, which is vertically aligned with the perforated diaphragm X, has an area, in top plan view, larger than the area of the opening TH. Consequently, a central portion of the membrane 2 overlies the opening TH, while peripheral portions of the membrane 2 overlie corresponding portions of the substrate 5, as well as the portions of the insulation layer 9 arranged on top of the latter.

More in particular, as may be seen in FIG. 2, each between the opening TH and the first portion 7a of the first cavity 6a defines a parallelepipedal shape; hence it has, in a plane perpendicular to the longitudinal axis H, the shape of a square or of a rectangle. Consequently, the cross section of the opening TH in a plane perpendicular to the longitudinal axis H has a rectangular or square shape, and the opening TH itself is delimited by four walls parallel to the longitudinal axis H, formed by the perforated diaphragm X. In this connection, illustrated in FIG. 1 are a first opening wall W1 and a second opening wall W2, opposite to one another, whereas illustrated in FIG. 2 are the first opening wall W1 and a third opening wall W3. Furthermore, even though it is not illustrated in FIG. 2, also the second portion 7b of the first cavity 6a substantially defines a parallelepipedal shape.

Even more in particular, the opening TH and the first and second portions 7a, 7b of the first cavity 6a are aligned along the longitudinal axis H. The perforated diaphragm X extends with a width l (measured in a direction perpendicular to the longitudinal axis H) towards the inside of the microelectromechanical sensing structure 1, starting from an internal surface $S_{in}$ that delimits the first portion 7a of the first cavity 6a. The internal surface $S_{in}$ is formed by four inner walls, and the perforated diaphragm X departs from said four inner walls. Illustrated in FIG. 1 are a first inner wall L1 and a second inner wall L2, opposite to one another.

The first cavity 6a is also known, as a whole, as "back chamber," in the case where the pressure wave impinges first on the rigid plate 3, and then on the membrane 2. In this case, the first cavity 6a performs the function of reference pressure chamber. Alternatively, it is in any case possible for the pressure waves to reach the membrane 2 through the first cavity 6a, which in this case performs the function of acoustic access port, and is hence known as "front chamber." In what follows, however, reference is made, except where otherwise specified, to the case where the first cavity 6a functions as back chamber, and the front chamber is formed by a second cavity 6b, which is delimited at the top and at the bottom, respectively, by the first plate layer 4a and by the membrane 2.

In greater detail, the membrane 2 has a first surface F1 and a second surface F2, which are opposite to one another and face, respectively, the first cavity 6a and the second cavity 6b. The first and second surfaces F1, F2 are hence in fluid communication with the back chamber and the front chamber, respectively; i.e., they are in contact with the fluids contained therein.

The membrane 2 is moreover anchored to the substrate 5 by means of membrane anchorages 8, which are formed by protuberances of the membrane 2, which extend, starting from peripheral regions of the membrane 2, towards the substrate 5. The insulation layer 9 enables, amongst other things, electrical insulation of the membrane anchorages 8 from the substrate 5.

The membrane anchorages 8 perform the function of suspending the membrane 2 over the substrate 5 at a certain distance therefrom; the value of this distance is a function of a compromise between the linearity of response at low frequencies and the noise of the capacitive microphone M.

In order to enable relief of the residual (tensile and/or compressive) stresses in the membrane 2, for example deriving from the manufacturing method, through openings 10 are formed through the membrane 2, in particular in the proximity of each membrane anchorage 8. The through openings 10 enable "equalization" of the static pressure present on the first and second surfaces F1, F2.

The rigid plate 3 is anchored to the substrate 5 by means of plate anchorages 11, which are connected to peripheral regions of the rigid plate 3. The plate anchorages 11 are formed by pillars made of the same conductive material as the first plate layer 4a, these pillars being arranged on top of the substrate 5 and being electrically insulated from the substrate 5 by means of the insulation layer 9. Furthermore, these pillars form a single piece with the first plate layer 4a.

The microelectromechanical sensing structure 1 further comprises a first sacrificial layer 12a, a second sacrificial layer 12b, and a third sacrificial layer 12c, arranged on top of one another. In particular, the third sacrificial layer 12c is arranged on top of the second sacrificial layer 12b, which is in turn arranged on top of the first sacrificial layer 12a, the latter being set on top of, and in direct contact with, the insulation layer 9.

The first, second, and third sacrificial layers 12a-12c are arranged, in top plan view, on the outside of the area occupied by the membrane 2 and by the plate anchorages 11. Peripheral portions of the rigid plate 3 extend on top of top portions of the third sacrificial layer 12c.

The rigid plate 3 moreover has a plurality of holes 13, which extend through the first and second plate layers 4a, 4b, have preferably circular sections and perform the function of favoring, during the manufacturing steps, removal of the underlying sacrificial layers. Furthermore, in use, the holes 13 enable free circulation of air between the rigid plate 3 and the membrane 2, in effect rendering the rigid plate 3 acoustically transparent. The holes 13 hence function as acoustic access port to enable the pressure waves to reach and deform the membrane 2.

The microelectromechanical sensing structure 1 further comprises an electrical membrane contact 14 and an electrical rigid-plate contact 15, which are made of conductive material and are used, in use, for biasing the membrane 2 and the rigid plate 3, as well as for picking up a signal indicating the capacitive variation consequent upon deformation of the membrane 2 caused by the pressure waves.

As illustrated in FIG. 1, the electrical membrane contact 14 extends partly into the second plate layer 4b. Furthermore, the electrical membrane contact 14 is electrically insulated from the first plate layer 4a and is electrically connected to the membrane 2, via to a conductive path (not illustrated).

The electrical rigid-plate contact 15 extends through the second plate layer 4b until it contacts the first plate layer 4a.

In a known way, the sensitivity of the capacitive microphone M depends upon the mechanical characteristics of the membrane 2, as well as upon the assembly of the membrane 2 and of the rigid plate 3. Furthermore, the performance of the capacitive microphone M depends upon the volume of the back chamber and upon the volume of the front chamber. In particular, the volume of the front chamber determines the upper resonance frequency of the capacitive microphone M, and hence its performance at high frequencies. In general, in fact, the smaller the volume of the front chamber, the greater the upper cutoff frequency of the capacitive microphone M. Furthermore, a large volume of the back chamber enables improvement of the frequency response and sensitivity of the capacitive microphone M itself.

Given this, as mentioned previously, in use the membrane 2 oscillates alternately in the direction of the rigid plate 3 or in the direction of the substrate 5. The membrane 2 hence moves alternately in the direction of the first plate layer 4a or in that of the substrate 5. In particular, each point of the membrane 2 moves in a substantially sinusoidal way, in a direction perpendicular to a direction defined by the membrane 2 itself in resting conditions. Again, more in particular, each point of the membrane 2 moves between a corresponding top position, which is at a distance from the position assumed by the same point in the resting condition equal to a corresponding displacement upwards, and a corresponding bottom position, which is at a distance from the position assumed by the same point in the resting condition equal to a corresponding displacement downwards. If we designate by "amplitude" the sum of the displacement downwards and of the displacement upwards, this amplitude is greater for the points of the membrane 2 that are further away from the membrane anchorages 8, also referred to as central points of the membrane 2, whereas it is smaller (at the limit, zero) for the points of the membrane 2 closer to the membrane anchorages 8, also referred to as peripheral points of the membrane 2. In what follows, reference will be made to the maximum displacement upwards and to the maximum displacement downwards to indicate the corresponding displacements of the point of the membrane 2 that oscillates with the maximum amplitude.

Furthermore, in general, reference will be made to the amplitude of the oscillations to indicate the amplitude of oscillation of the point of the membrane 2, among all the points of the membrane 2, that oscillates with maximum amplitude.

Since the degree of the oscillations of the membrane 2 may be such as to cause mechanical failure of the membrane 2 itself, solutions designed to limit the amplitude of the oscillations have been proposed.

For example, as mentioned previously, the protuberances P themselves of the rigid plate 3 function as upper stopper for the oscillations of the membrane 2. In fact, in the presence of large oscillations, the central portion of the membrane 2 abuts against one or more of these protuberances P, with consequent limitation of the amplitude of the oscillation. The protuberances P hence enable limitation of the maximum displacement upwards to which the membrane 2 is subjected.

As regards the maximum displacement downwards, its limitation is generally achieved by means of an appropriate sizing of the perforated diaphragm X. In fact, since the membrane 2 at least partially overlaps the perforated diaphragm X, in the presence of considerable oscillations, parts of the membrane 2 come to abut against the perforated diaphragm X, which to some extent limits deformation of the membrane 2. In other words, the membrane 2 is not free to undergo deformation, in the presence of pressure waves of sufficiently large amplitude within the opening TH, without contacting the perforated diaphragm X. The perforated diaphragm X hence functions as lower stopper for the oscillations of the membrane 2, since it prevents the central portion of the membrane 2 from oscillating with the same amplitude that would be obtained in the case of absence of the perforated diaphragm X.

However, the aforementioned mechanism of limitation of the maximum displacement downwards has proven satisfactory only in the case of oscillations of small amplitude. In fact, in the case of oscillations of considerable amplitude, it is possible for the membrane 2 to be subject in any case to failure, notwithstanding the stopping action exerted by the perforated diaphragm X.

There is consequently felt in the sector the need to provide a microelectromechanical sensing structure for a capacitive acoustic transducer that will solve at least in part the drawbacks of the known art.

BRIEF SUMMARY

According to one or more embodiments of the present disclosure, a microelectromechanical sensing structure and a manufacturing method are provided.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 1:
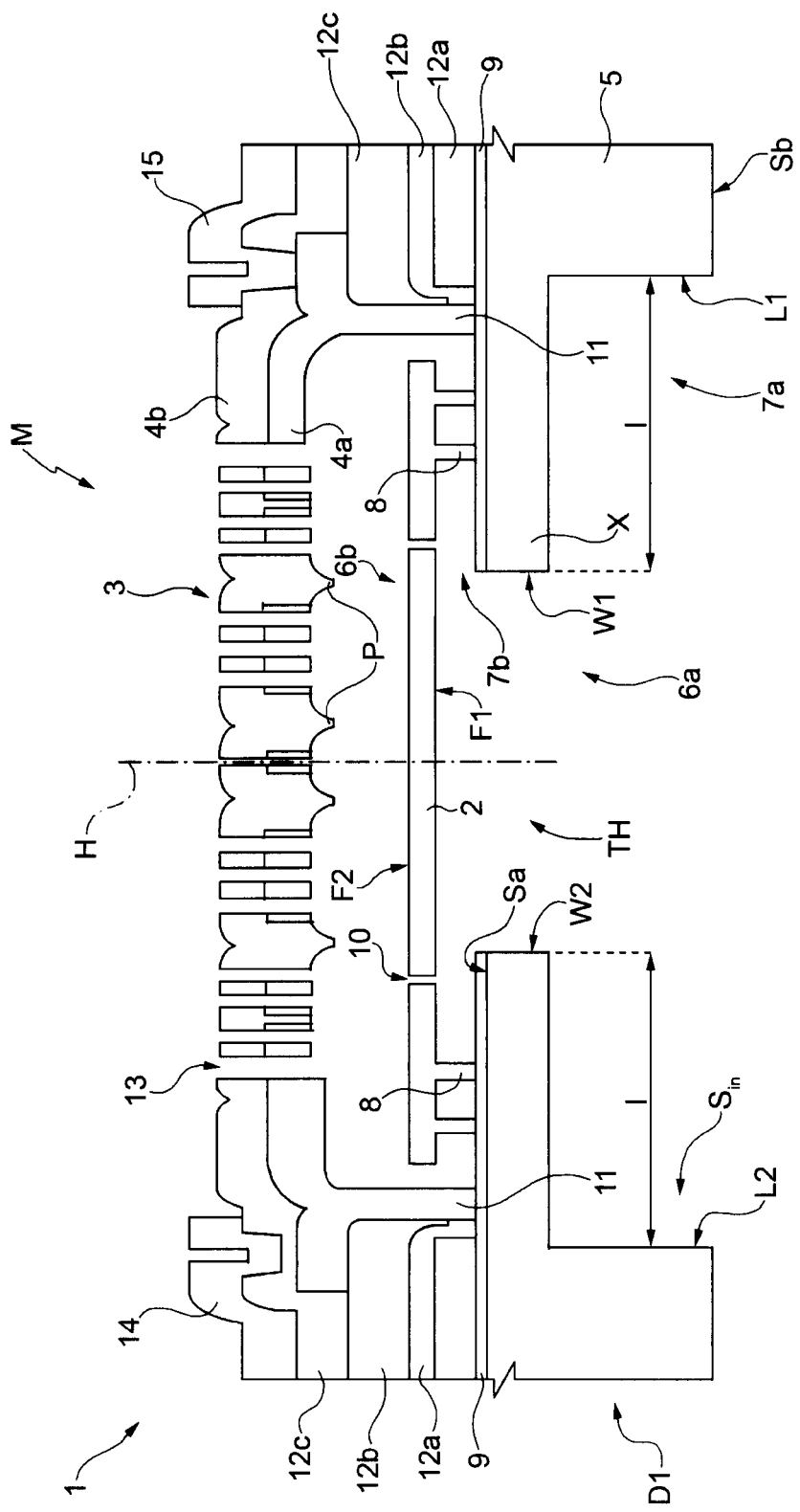
FIG. 1 shows a cross section of a microelectromechanical sensing structure of a MEMS capacitive microphone of a known type.
Figure 2:
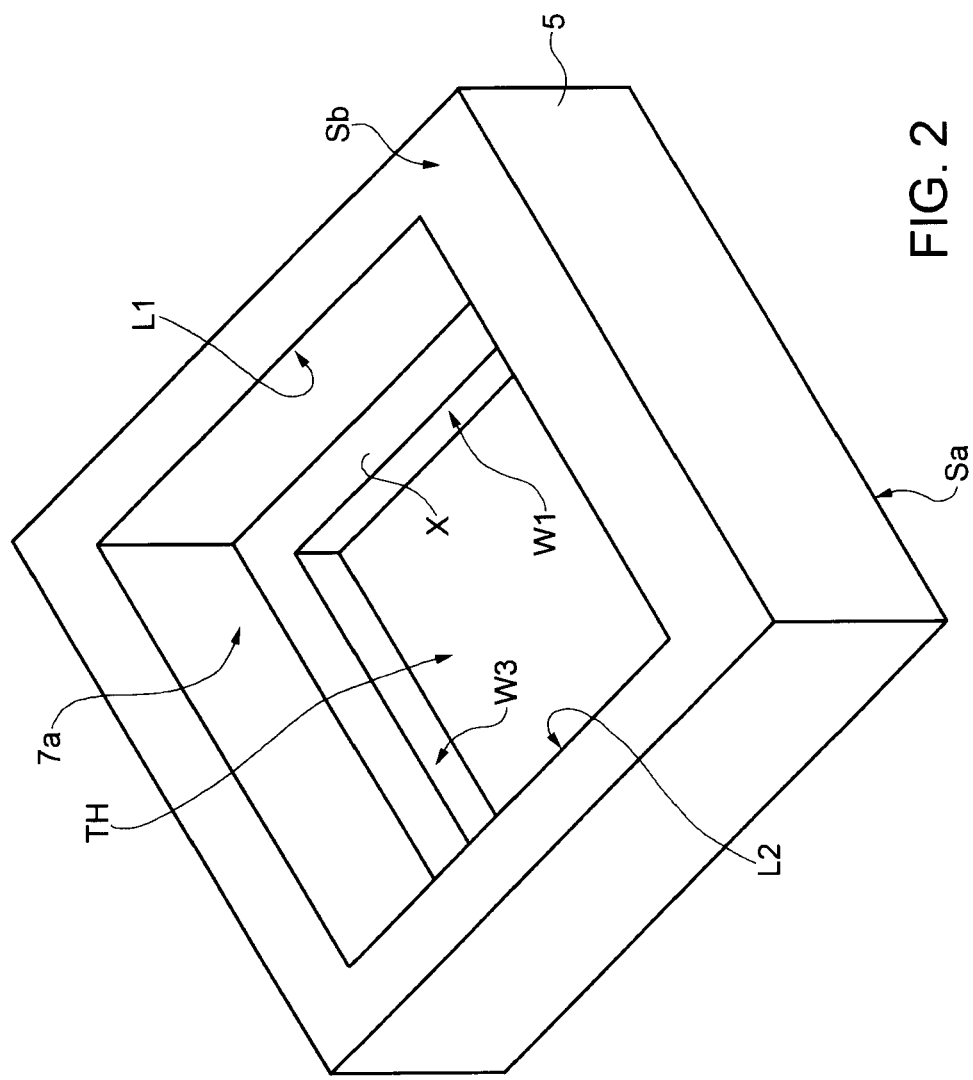
FIG. 2 is a schematic perspective view of a portion of the microelectromechanical sensing structure illustrated in FIG. 1.

FIG. 2 shows a microelectromechanical sensing structure 20 for a capacitive acoustic transducer, which is described in what follows, with reference just to the differences from the microelectromechanical sensing structure 1 illustrated in FIG. 1. For brevity, in what follows the microelectromechanical sensing structure 20 will be referred to as a "MEMS structure." Moreover, parts of the MEMS structure 20 already present in the microelectromechanical sensing structure 1 illustrated in FIG. 1 are designated by the same references, except where otherwise specified. Furthermore, it is assumed that the MEMS structure 20 is formed in a first die D1.

In detail, the MEMS structure 20 comprises an element for limiting the oscillations of the membrane 2, designated by 22 and having the shape of a beam which will be referred to hereinafter as "beam 22."

The beam 22 is made of semiconductor material. In the embodiment illustrated in FIG. 3, the beam 22 is formed by the substrate 5.

Figure 3:
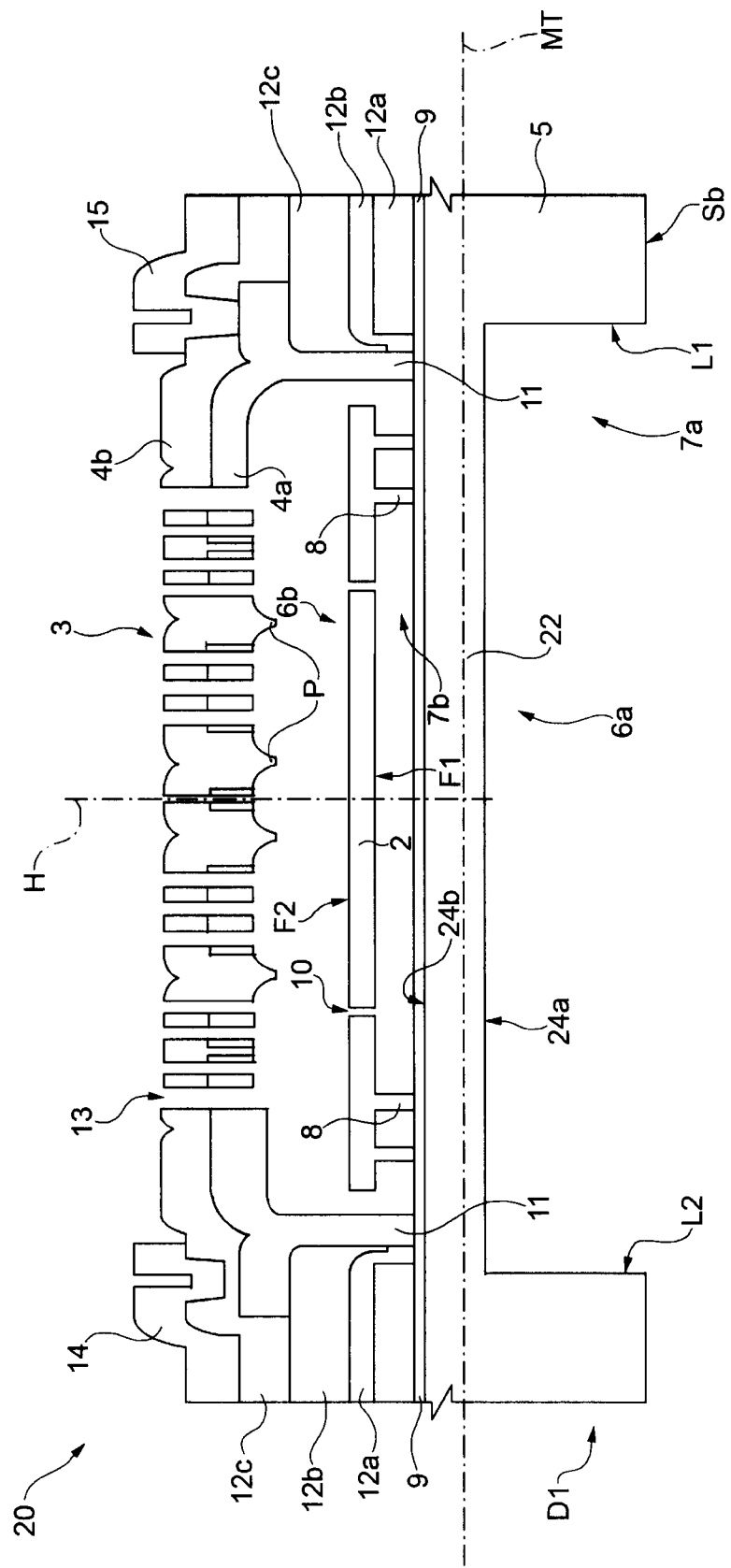
FIG. 3 shows a cross section of the present microelectromechanical sensing structure.

In top plan view, the beam 22 has an elongated shape, parallel to a transverse axis MT; in particular, in the embodiment illustrated in FIG. 3, the beam 22 has a parallelepipedal shape. The transverse axis MT is perpendicular to the longitudinal axis H and is parallel to the membrane 2, when the latter is in the resting condition; consequently, the beam 22 itself is parallel to the membrane 2, when the latter is in the resting condition.

Figure 4:
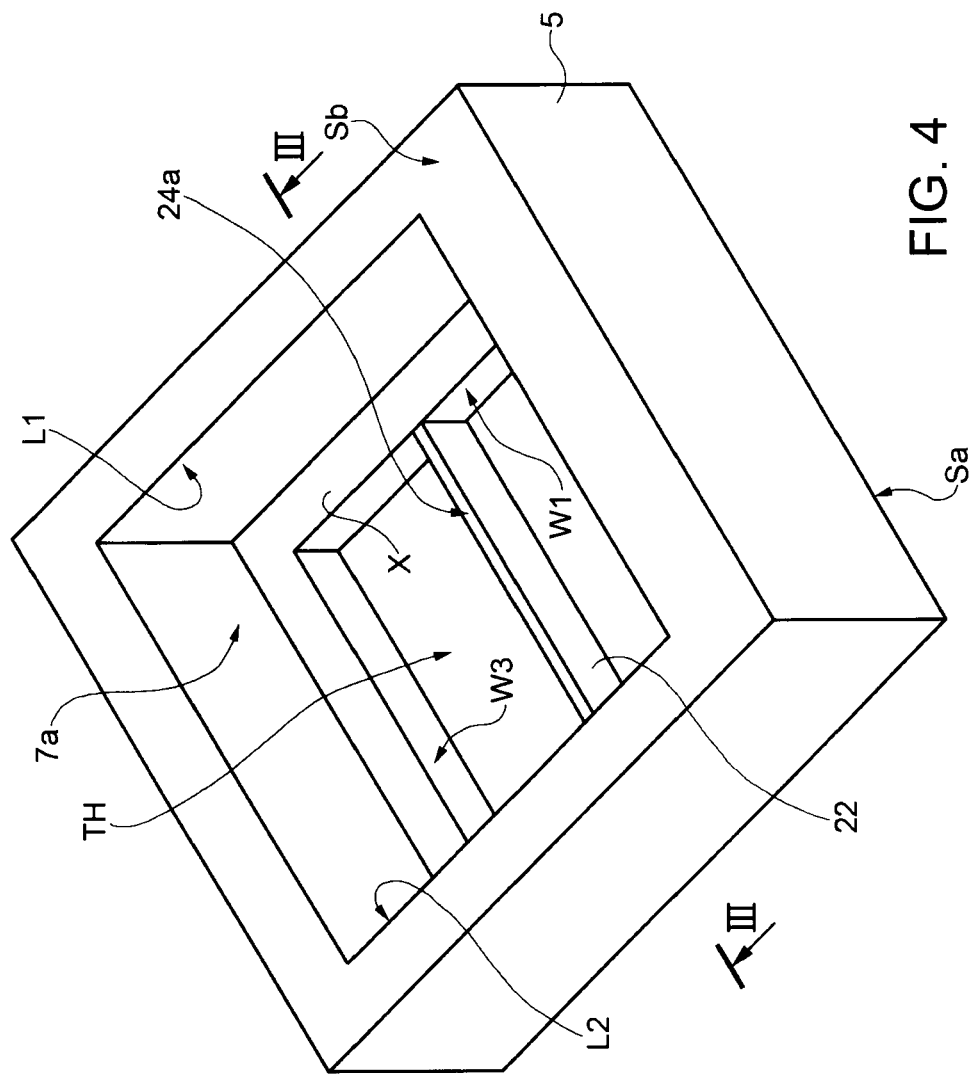
FIG. 4 is a schematic perspective view of a portion of the microelectromechanical sensing structure illustrated in FIG. 3, the cross section illustrated in FIG. 3 being taken along a line of section III-III indicated in FIG. 4.

In practice, as illustrated in FIG. 4, the beam 22 extends into the opening TH defined by the perforated diaphragm X (described with reference to FIG. 1). Consequently, the beam 22 extends between the first and second portions 7a, 7b of the first cavity 6a, which it faces. In particular, assuming that the beam 22 is delimited at the bottom and at the top by a first beam surface 24a and a second beam surface 24b, respectively, both of a planar type, the first beam surface 24a faces the first portion 7a of the first cavity 6a, while the second beam surface 24b faces the second portion 7b of the first cavity 6a. Furthermore, without this implying any loss of generality, in the embodiment illustrated in FIGS. 3 and 4 the second beam surface 24b is coplanar with the front surface $S_a$ of the substrate 5 and is internally coated by the top insulation layer 9. In addition, once again without this implying any loss of generality, the beam 22 has a thickness, measured parallel to the longitudinal axis H, equal to the thickness of the perforated diaphragm X.

In detail, the beam 22 extends between the first and second opening walls W1, W2 (the latter being illustrated in FIG. 1), to which it is connected.

Still in greater detail, each between the first and second beam surfaces 24a, 24b has the shape of a rectangle and has an area $A_{22}$ such that, if $A_{TH}$ the area of any cross section of the opening TH taken in a plane perpendicular to the longitudinal axis H, the relation $A_{22} \leq 0.3 \cdot A_{TH}$ applies. In this way, the presence of the beam 22 is prevented from jeopardizing the frequency response of the MEMS structure 20.

Furthermore, in the resting condition, the beam 22 is at a distance from the first surface F1 of the membrane 2, a distance such that, in the presence of pressure waves of large amplitude, a central portion of the membrane 2 (in particular, of the first surface F1) abuts against the second beam surface 24b, which thus forms a contact surface. The beam 22 hence functions as element designed to limit the amplitude of the oscillations to which the membrane 2 is subjected; consequently, the beam 22 prevents failure of the membrane 2. Instead, in the presence of pressure waves of small amplitude, the membrane 2, and in particular the central portion of the membrane 2, is free to oscillate, without coming into contact with the second beam surface 24b. What is considered large and small amplitudes will depend on the membrane parameters, such as thickness, length, material properties, etc. as is well known in the art. In one embodiment, a large amplitude may be one that would plastically deform the membrane. Thus, an amplitude that is less than such a large amplitude would likely be the threshold amplitude to prevent the membrane from plastically deforming.

In greater detail, the beam 22 is arranged from the first surface F1 of the membrane 2 at a distance $d = k \cdot h_2$, where $h_2$ is equal to the thickness of the membrane 2, measured parallel to the longitudinal axis H, and k is comprised, for example, in the range 2, 4. The thickness $h_2$ is the smallest of the three dimensions of the membrane 2.

Figure 5:
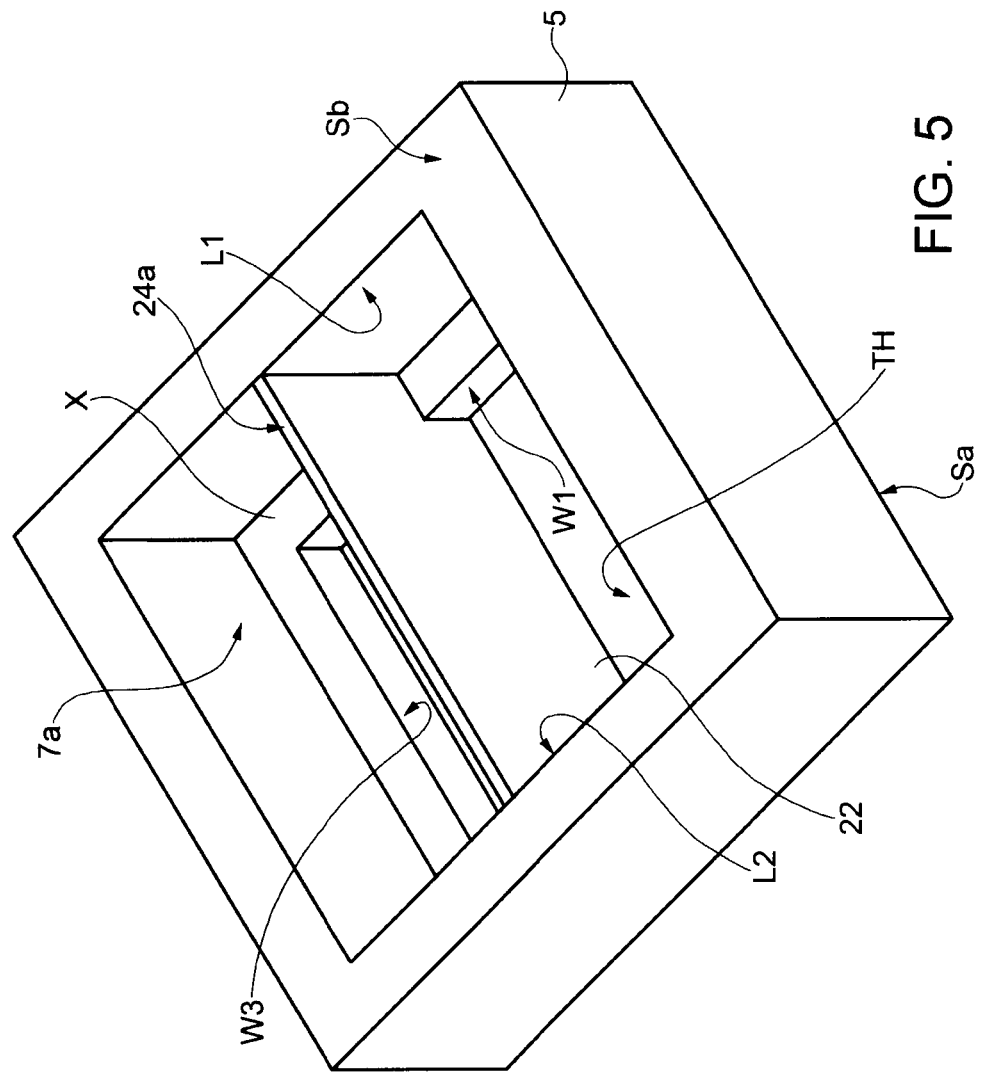
FIGS. 5 and 7 are schematic perspective views of portions of different embodiments of the present microelectromechanical sensing structure.

According to a different embodiment, illustrated in FIG. 5, the beam 22 has a thickness equal to the thickness of the substrate 5. In this case, the beam 22 extends not only between the first and second opening walls W1, W2 but also between the first and second inner walls L1, L2, which delimit the first portion 7a of the first cavity 6a. The beam 22 is hence connected also to the first and second inner walls L1, L2.

The embodiment illustrated in FIG. 5 is also characterized by a high resilience to phenomena of electrostatic discharge. In fact, assuming, for example, that the first cavity 6a functions as front chamber, and hence gives out onto an inlet hole of a package containing the MEMS structure 20, a possible spark coming from outside encounters first the beam 22, and subsequently the membrane 2. Consequently, the beam 22 acts as structure designed to discharge into the substrate 5 the spark before the latter reaches the membrane 2.

Figure 6:
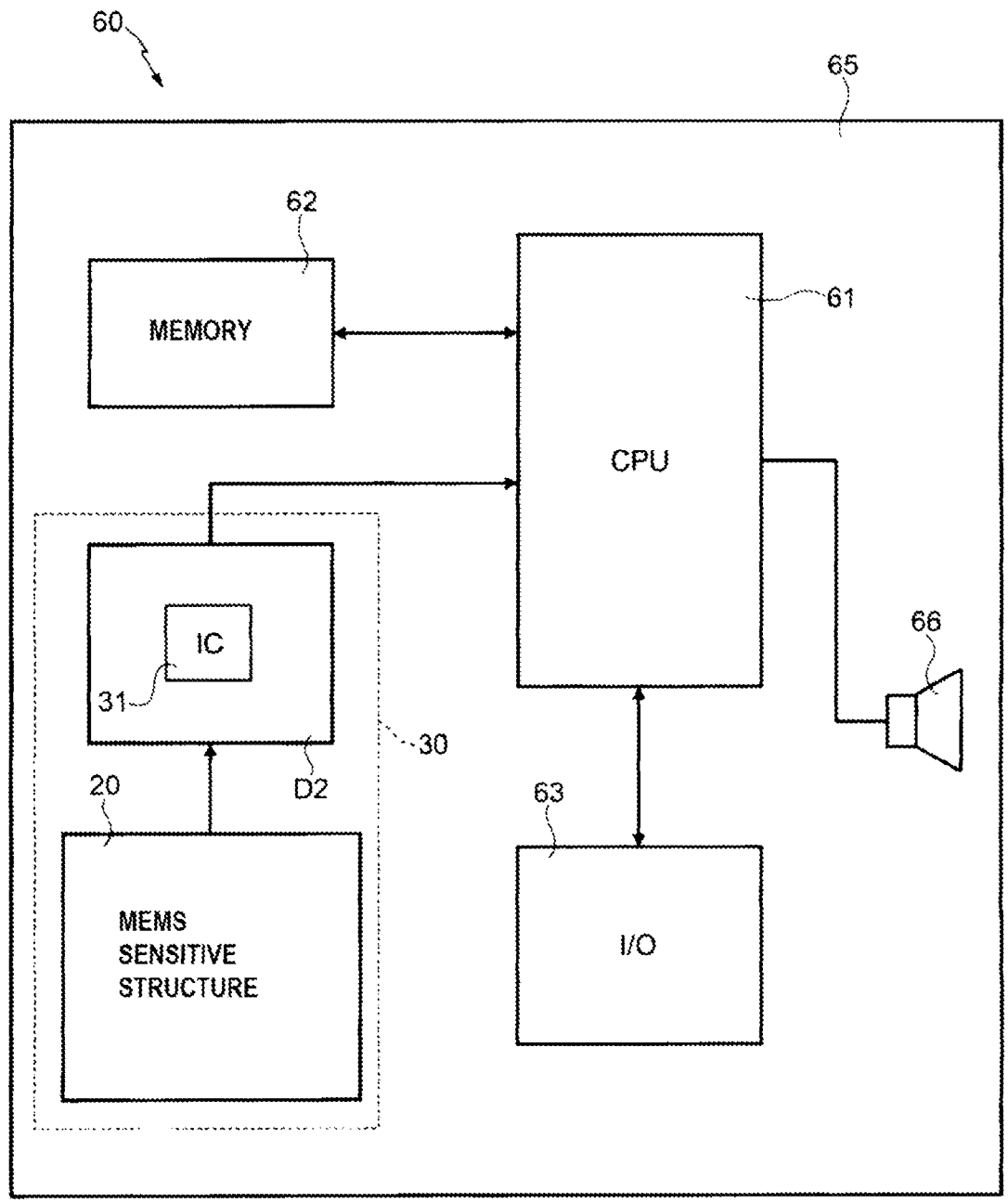
FIG. 6 shows a simplified block diagram of an electronic device including the present microelectromechanical sensing structure.

As illustrated in FIG. 6, the MEMS structure 20 can form a MEMS capacitive microphone 30, which includes, in addition to the MEMS structure 20, a second die D2, which integrates an integrated circuit 31, for example of the so-called ASIC (application-specific integrated circuit) type.

The integrated circuit 31 is electrically connected to the electrical membrane contact 14 and to the electrical rigid-plate contact 15 of the MEMS structure 20. In addition, the integrated circuit 31 forms a read circuit designed to generate an electrical signal indicating the variations of the capacitance of the sensing capacitor formed by the membrane 2 and by the first plate layer 4a, which will be referred to hereinafter as "detection signal."

Advantageously, the MEMS capacitive microphone 30 can form an electronic device 60, illustrated once again in FIG. 6.

The electronic device 60 is, for example, a mobile communication device, such as for example a cellphone, a personal digital assistant, a notebook, but also a voice recorder, a player of audio files with voice-recording capacity, etc. Alternatively, the electronic device 60 may be a hydrophone, which is able to work underwater, or else a wearable device, such as a hearing-aid device.

The electronic device 60 comprises a microprocessor 61, a memory block 62, connected to the microprocessor 61, and an input/output interface 63, for example having a keyboard and a display, which is also connected to the microprocessor 61. The MEMS capacitive microphone 30 communicates with the microprocessor 61. In particular, the integrated circuit 31 sends the aforementioned detection signal to the microprocessor 61, possibly after prior processing by a further electronic processing circuit (not illustrated). Although not shown, it is to be appreciated that the electronic device 60 includes a power source, such as a battery.

The electronic device 60 further comprises a speaker 66 designed to generate sounds on an audio output (not illustrated) of the electronic device 60.

For example, the MEMS capacitive microphone 30, the microprocessor 61, the memory block 62, the input/output interface 63, and the possible further electronic components are mounted on a single printed circuit board (PCB) 65, for example with the surface-mount technique.

The advantages that the present microelectromechanical sensing structure affords emerge clearly from the foregoing discussion.

In particular, the present microelectromechanical sensing structure prevents failure of the membrane, without jeopardizing the frequency response of the microelectromechanical sensing structure itself.

Finally, it is clear that modifications and variations may be made to what has been described and illustrated herein, without thereby departing from the sphere of protection of the present disclosure.

In particular, the beam 22 may be made of a material different from the material of the substrate 5. Furthermore, the beam 22 may have a thickness different from (for example, smaller than) the thickness of the perforated diaphragm X.

In addition, embodiments are possible in which the opening TH and the first and second portions 7a, 7b of the first cavity 6a have different shapes, such as for example cylindrical shapes. In this case, the opening TH is delimited by a cylindrical wall; hence the beam 22 extends starting from a first portion and a second portion of this cylindrical wall.

Furthermore, embodiments are possible in which the opening TH does not have a uniform cross section along the longitudinal axis H. For example, the opening TH may have a frustoconical shape. In this case, the aforementioned relation $A_{22} \leq 0.3 \cdot A_{TH}$ again applies on the hypothesis of considering $A_{TH}$ equal to the area of the cross section of the opening TH coplanar with the second beam surface 24b.

Figure 7:
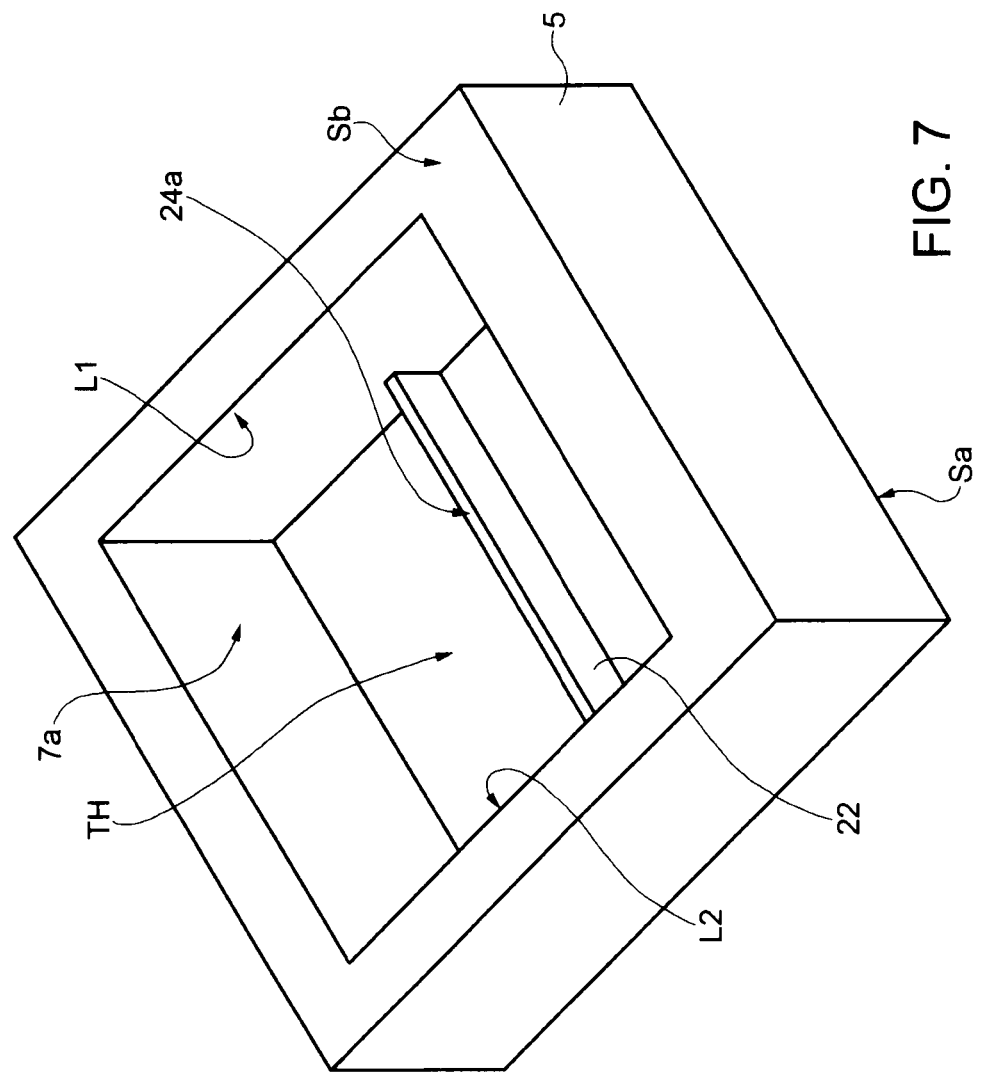

Finally, embodiments are possible of the type illustrated previously, but in which the perforated diaphragm X is absent, as illustrated for example in FIG. 7. In this case, the beam 22 is connected to the first and second inner walls L1, L2. It should be noted that in this case the aforementioned relation $A_{22} \leq 0.3 \cdot A_{TH}$ again applies on the hypothesis of considering $A_{TH}$ equal to the area of a cross section of the first portion 7a of the first cavity 6a, taken in the plane coplanar to the second beam surface 24b.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectromechanical sensing structure, comprising:
   a substrate of semiconductor material;
   a sensing capacitor that includes:

a rigid conductive electrode;
a conductive membrane coupled to the substrate and arranged between the substrate and the electrode, the membrane having a first surface and a second surface, the membrane being configured to deform in response to pressure, the sensing capacitor having a capacitance that varies as a function of the deformation of the membrane;
a first chamber delimited at least in part by the substrate and the first surface of the membrane;
a second chamber being delimited at least in part by the electrode and the second surface of the membrane; and
a beam located in the first chamber and coupled to the substrate, the beam being configured to limit oscillations of the membrane when the pressure has an amplitude that is above a first threshold, thereby preventing plastic deformation of the membrane.

2. The microelectromechanical sensing structure according to claim 1, wherein:
the beam is configured to limit oscillations of the membrane when the amplitude is above the first threshold by abutting against the membrane; and
when the pressure has an amplitude that is below a second threshold, the membrane is free to oscillate.

3. The microelectromechanical sensing structure according to claim 1, wherein the substrate includes a through opening that extends into the first chamber, wherein the beam is located in the through opening.

4. The microelectromechanical sensing structure according to claim 3, wherein the membrane has a membrane thickness, and in the rest condition, the membrane located a distance from the beam, wherein the distance is between two and four times the membrane thickness.

5. The microelectromechanical sensing structure according to claim 3, wherein the beam has a longitudinal length along an axis, the first and second surfaces of the membrane being parallel to said axis when the membrane is in the resting condition.

6. The microelectromechanical sensing structure according to claim 5, wherein the beam has a contact surface configured to contact the membrane and having a first area not greater than 30% of a second area of a cross section of the through opening, the cross section being taken in a plane coplanar to the contact surface.

7. The microelectromechanical sensing structure according to claim 1, wherein the beam has a first thickness and the substrate has a second thickness that is substantially equal to the first thickness.

8. The microelectromechanical sensing structure according to claim 1, wherein the beam has a first thickness and the substrate has a second thickness that is greater than the first thickness.

9. The microelectromechanical sensing structure according to claim 1, wherein the beam is made of semiconductor material.

10. A microelectromechanical acoustic transducer comprising:
a sensitive structure that includes:
a semiconductor substrate having a through opening delimited by sidewalls;
a sensing capacitor that includes:
a rigid conductive electrode;
a conductive membrane coupled to the substrate and located between the substrate and the electrode, the membrane having a first surface and a second surface, the membrane being configured to deform in response to pressure, the sensing capacitor having a capacitance that varies as a function of the deformation of the membrane;
a first chamber delimited at least in part by the sidewalls of the through opening of the substrate and the first surface of the membrane;
a second chamber being delimited at least in part by the electrode and the second surface of the membrane; and
a beam located in the first chamber and coupled to the substrate, the beam being configured to limit oscillations of the membrane when the pressure has an amplitude that is above a first threshold, the first threshold being within an elastic deformation range of the membrane; and
an electronic read circuit operatively coupled to said sensitive structure and configured for output an electrical detection signal indicative of the capacitance of said sensing capacitor.

11. The microeletromechanical acoustic transducer according to claim 10 wherein the membrane includes a through hole that places the first chamber is fluid communication with the second chamber.

12. The microelectromechanical acoustic transducer according to claim 10 wherein the beam has a longitudinal length that spans a length of the through opening of the substrate and a width that is a fraction of the through opening.

13. The microelectromechanical acoustic transducer according to claim 10 wherein the beam is part of the substrate.

14. The microelectromechanical acoustic transducer according to claim 10 wherein the substrate has a first thickness and the beam has a second thickness that is smaller than the first thickness.

15. The microeletromechanical acoustic transducer according to claim 10 wherein the electrode has a plurality of through holes that place the second chamber is fluid communication with an environment that is outside of the microelectromechancial acoustic transducer.

16. An electronic device comprising:
an acoustic transducer including:
a sensitive structure that includes:
a semiconductor substrate having a through opening delimited by sidewalls;
a sensing capacitor that includes:
a rigid conductive electrode;
a conductive membrane coupled to the substrate and located between the substrate and the electrode, the membrane having a first surface and a second surface, the membrane being configured to deform in response to pressure, the sensing capacitor having a capacitance that varies as a function of the deformation of the membrane;
a first chamber delimited at least in part by the sidewalls of the through opening of the substrate and the first surface of the membrane;
a second chamber being delimited at least in part by the electrode and the second surface of the membrane; and
a beam located in the first chamber and coupled to the substrate, the beam being configured to limit oscillations of the membrane when the pressure has an amplitude that is above a first threshold, wherein below the first threshold the membrane is configured to elastically deform and above the first threshold the membrane is configured to plastically deform; and an electronic read circuit operatively coupled to said sensitive structure and configured for output an electrical detection signal indicative of the capacitance of said sensing capacitor.

17. The electronic device according to claim 16 wherein said electronic device is at least one of the following: a cellphone, a personal digital assistant, a notebook, a voice recorder, an audio player with functions of voice recorder, a console for videogames, a hydrophone, and a hearing-aid device.

18. A process comprising:

forming a rigid electrode; and forming a conductive membrane that is coupled to a substrate and arranged between the substrate and the electrode, the membrane having a first surface and a second surface, the membrane being configured to deform in response to pressure, the membrane and the electrode forming a sensing capacitor having a capacitance that varies as a function of the deformation of the membrane;

forming a first chamber that is delimited at least in part by the electrode and the second surface of the membrane;

forming a second chamber that is delimited at least in part by the first surface of the membrane and the substrate; and forming a beam that is coupled to the substrate and is configured to limit oscillations of the membrane that are above a threshold, thereby preventing plastic deformation of the membrane.

19. The process according to claim 18, further comprising forming a through hole having sidewalls in the substrate, the second chamber being delimited at least in part by the sidewalls of the through hole in the substrate.

20. The process according to claim 18, wherein forming the beam comprises etching the substrate to form the beam.

21. The process according to claim 18, wherein forming the beam comprises forming a beam having a first thickness that is less than a second thickness of the substrate.

* * * * *